United States Patent
Yoshida et al.

(10) Patent No.: US 7,540,931 B2
(45) Date of Patent: Jun. 2, 2009

(54) METHOD OF PRODUCING CERAMIC GREEN SHEET AND METHOD OF PRODUCING ELECTRONIC COMPONENT USING THIS CERAMIC GREEN SHEET

(75) Inventors: Masayuki Yoshida, Tokyo (JP); Junichi Suto, Tokyo (JP); Shunji Aoki, Tokyo (JP); Genichi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 543 days.

(21) Appl. No.: 10/543,710

(22) PCT Filed: Jan. 30, 2004

(86) PCT No.: PCT/JP2004/000950

§ 371 (c)(1),
(2), (4) Date: Jul. 28, 2005

(87) PCT Pub. No.: WO2004/068516

PCT Pub. Date: Aug. 12, 2004

(65) Prior Publication Data

US 2006/0213602 A1    Sep. 28, 2006

(30) Foreign Application Priority Data

Jan. 31, 2003  (JP) ............ 2003-023245
Jul. 30, 2003  (JP) ............ 2003-282557

(51) Int. Cl.
*C03B 29/00*    (2006.01)
*G03F 1/00*    (2006.01)

(52) U.S. Cl. ............ 156/89.11; 156/89.12; 156/89.16; 430/322

(58) Field of Classification Search ............ 156/89.12, 156/89.14, 275.5, 89.11; 430/322
See application file for complete search history.

(56) References Cited

U.S. PATENT DOCUMENTS 4,828,961 A * 5/1989 Lau et al. ............ 430/198
6,004,705 A * 12/1999 Masaki et al. ............ 430/15
6,159,322 A * 12/2000 Ogata et al. ............ 156/230
7,232,496 B2 * 6/2007 Yoshida et al. ............ 156/89.12

(Continued)

FOREIGN PATENT DOCUMENTS

CN    1090399 A    8/1994

(Continued)

OTHER PUBLICATIONS

U.S. Appl. No. 10/543,710, filed Jul. 28, 2005, Yoshida, et al.

*Primary Examiner*—Philip C Tucker
*Assistant Examiner*—Michael N Orlando
(74) *Attorney, Agent, or Firm*—Oblon, Spivak, McClelland, Maier & Neustadt, P.C.

(57) ABSTRACT

An object of the invention is to provide a flat ceramic sheet including an internal electrode used for manufacturing a multilayer ceramic electronic part. Specifically, an electrode portion is formed on a surface of a transparent base member, and a photosensitive slurry containing dielectric powder is applied thereon. The photosensitive slurry is exposed from the backside of the base member up to a predetermined thickness, and then it is subjected to development. After that, the base member is removed. Thus, a ceramic green sheet is obtained.

7 Claims, 15 Drawing Sheets

U.S. PATENT DOCUMENTS

| | | |
|---|---|---|
| 7,326,310 B2 * | 2/2008 | Yoshida et al. ............ 156/89.11 |
| 2002/0022141 A1 * | 2/2002 | Nakamura et al. ........... 428/480 |
| 2004/0134875 A1 * | 7/2004 | Fukami et al. ................. 216/13 |
| 2005/0045268 A1 | 3/2005 | Yoshida et al. |
| 2005/0048415 A1 | 3/2005 | Yoshida et al. |
| 2005/0079450 A1 | 4/2005 | Yoshida et al. |

FOREIGN PATENT DOCUMENTS

| | | | |
|---|---|---|---|
| EP | 0 589 241 | * | 3/1994 |
| JP | 47-006704 | | 4/1972 |
| JP | 62-98799 | | 5/1987 |
| JP | 04-215414 | | 8/1992 |
| JP | 6-77074 | | 3/1994 |
| JP | 08-023102 | | 1/1996 |
| JP | 09-115766 | | 5/1997 |
| JP | 09-181450 | | 7/1997 |
| JP | 11-154782 | | 6/1999 |
| JP | 11-330658 | | 11/1999 |
| JP | 2000-147758 | | 5/2000 |
| JP | 2002-026046 | | 1/2002 |
| JP | 2002-221801 | | 8/2002 |
| JP | 2004-179181 | * | 6/2004 |
| JP | 2004-179524 | | 6/2004 |
| JP | 2004-179525 | | 6/2004 |

* cited by examiner

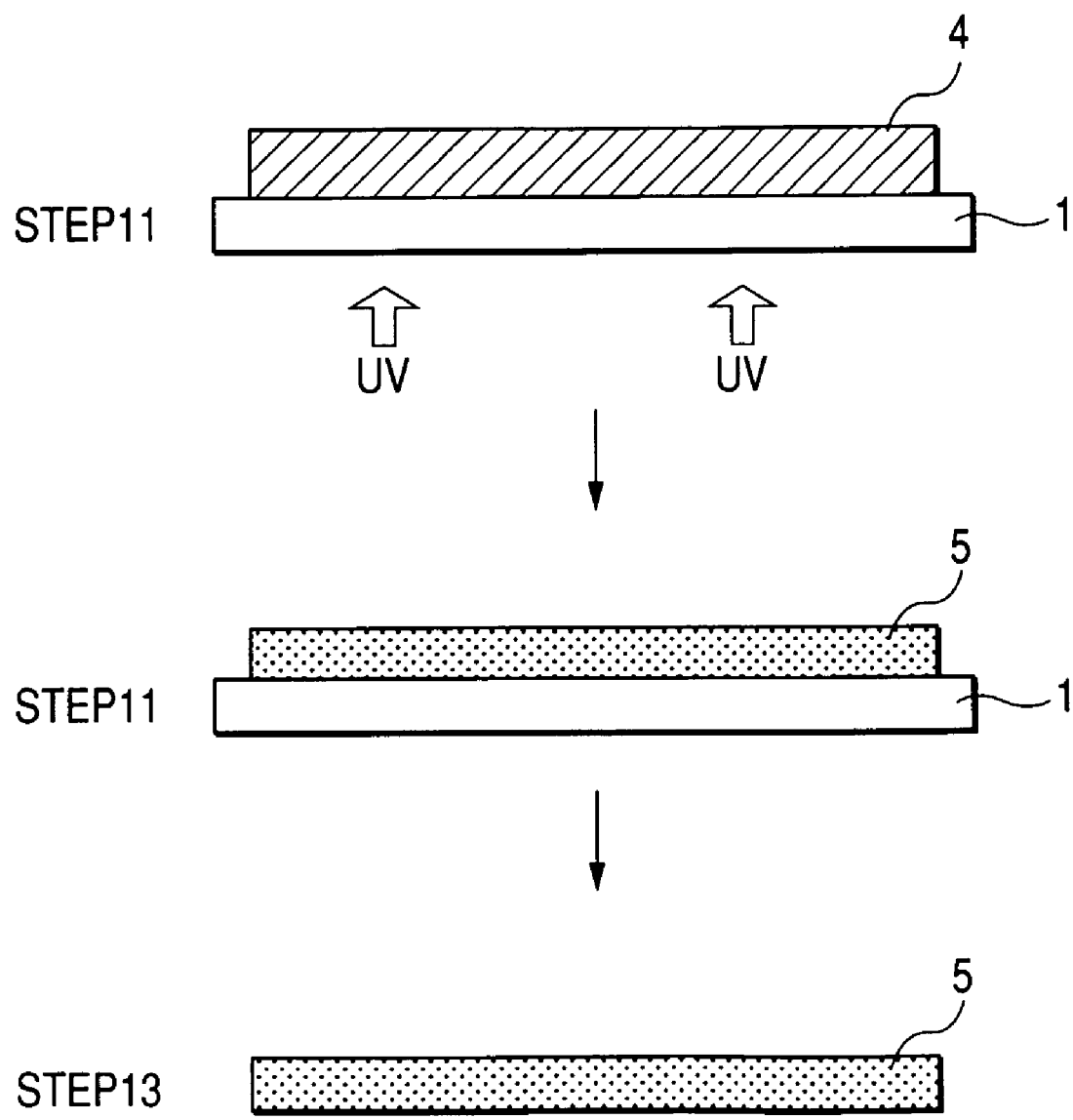

METHOD OF PRODUCING CERAMIC GREEN SHEET AND METHOD OF PRODUCING ELECTRONIC COMPONENT USING THIS CERAMIC GREEN SHEET

TECHNICAL FIELD

The present invention relates to a method of manufacturing an electronic part, especially an electronic part that is formed by laminating ceramic layers, which is exemplified by a so-called multilayer ceramic electronic part. The present invention also relates to a method of manufacturing a so-called ceramic green sheet used in the aforementioned method. The multiplayer ceramic electronic parts mentioned here include, for example, multilayer ceramic capacitors, multilayer ceramic inductors, LC composite parts including capacitors and inductors formed therein, or EMC related parts etc.

BACKGROUND ART

In recent years, with downsizing and rapid popularization of electronic apparatuses represented by cellular phones, an increase in mounting density of the electronic parts used for these apparatuses and improvement in their performance are required. Especially, demands for thickness reduction, an increase in the number of layers and uniformization of each layer are placed on multilayer ceramic electronic parts that are used as passive elements, in order to meet the above requirements. In addition, development of the manufacturing method that can meet these requirements is also-demanded.

So called metal-ceramic composite sintering is an example of conventional manufacturing method used for manufacturing the aforementioned multilayer ceramic electronic parts such as multilayer ceramic capacitors having electrodes formed in the interior thereof, which can meet the aforementioned requirements. Here, the metal-ceramic composite sintering technology will be described briefly. In this technology, a plurality of electrodes are simultaneously formed on a so-called ceramic green sheet using an electrically conductive paste composed of a metal powder and an organic binder material.

Subsequently, a plurality of simple ceramic green sheets and ceramic green sheets on which electrodes have been formed etc. are laminated to form a ceramic laminated member. The electrodes will constitute internal electrodes of multilayer ceramic electronic parts when they are finished. In addition, the ceramic laminated member is pressed in its thickness direction so that the green sheets will be brought into close contact with each other. The laminated member brought into close contact is cut and separated to a certain size, and then subjected to sintering. On the outer surface of the sintered member thus obtained, external electrodes are formed fitly. Thus, a multilayer ceramic electronic part is obtained.

In recent years, further downsizing and thickness reduction of the aforementioned multilayer ceramic electronic parts have been required, and it is necessary to reduce the thickness of dielectric layers made of a ceramic or the like sandwiched between internal electrodes. Therefore, it is required to perform the above-described process while further reducing the thickness of ceramic green sheets that constitute the ceramic laminated member. In view of these requirements, the thickness of the thinnest ceramic green sheet presently used is as small as approximately 2 to 3 μm.

However, electrodes printed on the ceramic green sheets have a thickness of approximately 1.5 to 2.0 μm. Accordingly, when a ceramic laminated member is formed, the thickness of the portion where the internal electrode is laminated becomes very large as compared to the thickness of the portion where the internal electrode is not present. Consequently, unevenness is likely to be produced. In addition, such unevenness can cause lamination displacement upon laminating a green sheet.

As described above, the laminated member is pressed in the thickness direction after it is formed, and preferably, the above-mentioned unevenness will be nearly eliminated by the pressing process. However, a pressing pressure of, for example, as large as 1 ton/cm$^2$ is required to achieve pressure contact of the green sheets and internal electrodes, and improvements in this process are required. In addition, since the applied pressure is localized only in the portions on which internal electrodes are present, there is a risk that insufficiency of pressing in the other areas or deformation after pressing may occur. Furthermore, such localization of applied pressure may sometimes lead to interlaminate separation called delamination in the laminated member after sintering.

Such deformations of the laminated member result in problems such as, for example in the case of the multilayer ceramic capacitor, variations in the electric capacity. Such problems contribute to generation of or increase in variations of electric characteristics of compact, highly-integrated, multilayer ceramic electronic parts such as multilayer ceramic inductors, LC composite parts and EMC related parts.

The technology disclosed in Japanese Patent Application Laid-Open No. 9-115766 was devised with a view to prevent generation of the above-mentioned unevenness. Specifically, in forming electrodes on a green sheet by screen printing, an electrically conductive paste composed of an organic binder having water-repellent properties and a metal powder is used. In addition, after electrodes are formed, water-based ceramic slurry is applied on them. The slurry is repelled from the electrode by virtue of the aforementioned water-repellent properties, so that a ceramic sheet that fills the unevenness is formed around the electrode patterns.

In this technology, however, a gap is formed between the side surface of the internal electrode and the water-based slurry, and there is a risk that displacement in lamination may be caused by the gap. Moreover, adhesion strength of the interface between the surface of the water-repellent electrode and the ceramic green sheet pressed against it may possibly be weaker than the adhesion strength between a conventional electrode and a sheet. Furthermore, it is considered that in the region surrounded by water repellent electrodes, the thickness of the water-based slurry is likely to be increased due to its surface tension. This may lead to a decrease in the degree of accuracy of lamination.

Japanese Patent Application Laid-Open No. 4-215414 discloses a technology in which recesses are formed at the positions on a ceramic green sheet at which electrodes are formed, and the recesses are filled with electrically conductive paste by screen printing to reduce unevenness caused by thickness of electrodes on a ceramic sheet. However, in the case where the green sheet is thin, the green sheet is deformed by the projections of the base member on which the green sheet is formed. Consequently, in the green sheet produced, projections are formed at the positions corresponding to the recesses on the surface of the green sheet opposite to the surface on which the recesses are formed.

Accordingly, when screen printing for filling the recesses with electrically conductive paste is performed, there is a risk that the recesses may deform to cause problems concerning accuracy of the shape of the recesses and their positions etc. Therefore, it is practically impossible to match the accuracy of recess formation and accuracy of electrode formation by screen printing, and there is a risk that unevenness or gaps may be created on the sheet due to the difference between these position accuracies or positional displacement in forming them. In addition, the presence of projections will promote generation of formation density difference when laminated layers are pressed as described in connection with the Japanese Patent Application Laid-Open No. 4-215414. Accordingly, although generation of unevenness is suppressed to some extent, it is considered that the above-mentioned variations in electric characteristics still occur.

DISCLOSURE OF THE INVENTION

The present invention has been made in view of the above problems and background. An object of the present invention is to provide a method of producing a sheet including a ceramic green sheet and internal electrodes formed on it while reducing unevenness between the layers. (Hereinafter, a ceramic green sheet with internal electrodes formed thereon will be collectively referred to as a ceramic green sheet in this specification for the sake of simplicity in descriptions.) The method is intended to achieve the object of reducing variations in electric characteristics of multilayer ceramic electronic parts and reducing the frequency of occurrence of interlaminate separation etc. during sintering of the laminated member or preventing interlaminate separation from occurring.

To achieve the above object, according to the present invention, there is provided a method of producing a ceramic green sheet utilizing an exposure process and a development process, comprising a step of attaching a photosensitive material containing a powder that has a specific electric characteristic on a surface of a base member that can transmit light used in said exposure process, said photosensitive material having sensitivity to said light, a step of irradiating said photosensitive material with said light from the backside of said base member to perform said exposure process with such an exposure dose that said photosensitive material is exposed up to a predetermined thickness from said base member, and a step of performing said development process on said photosensitive material after said exposure process.

To achieve the above object, according to the present invention, there is provided a method of producing a ceramic green sheet utilizing an exposure process and a development process, comprising a step of attaching a first photosensitive material containing a powder that has a specific electric characteristic on a surface of a base member that can transmit light used in said exposure process, said first photosensitive material having sensitivity to said light, a step of irradiating said first photosensitive material with said light from the backside of said base member to perform said exposure process with such an exposure dose that said first photosensitive material is exposed up to a first predetermined thickness range from said base member, a step of performing said development process on said first photosensitive material after said exposure process, a step of forming a light blocking portion composed of a member that does not transmit the light used in said exposure process on a surface of said first photosensitive material after said development process; a step of attaching a second photosensitive material containing a powder that has a specific electric characteristic on a surface of said light blocking portion and said first photosensitive material after said development process, said second photosensitive material having sensitivity to the light, a step of irradiating said second photosensitive material with said light from the backside of said base member to perform said exposure process with such an exposure dose that said second photosensitive material is exposed up to a second predetermined thickness range from the surface of said first photosensitive material, and a step of performing said development process on said second photosensitive material after said exposure process.

In the above-described production method, it is preferred that a step of forming a light blocking portion composed of a member that does not transmit the light used in said exposure process on the surface of said base member be performed prior to the step of attaching said photosensitive material to said base member. It is also preferred that the predetermined thickness of the exposed portion of said photosensitive material be substantially equal to the thickness of said light blocking portion.

In the above-described production method, it is preferred that a step of forming a different light blocking portion, composed of a member that does not transmit the light used in said exposure process, other than said light blocking portion on the surface of said base member be performed prior to the step of attaching said first photosensitive material to said base member and exposing and developing it. Moreover, it is preferred that the first predetermined thickness of the exposed portion of said first photosensitive material be substantially equal to the thickness of said different light blocking portion. In addition, it is preferred that the second predetermined thickness of the exposed portion of said second photosensitive material be substantially equal to the thickness of said light blocking portion.

To achieve the above object, according to the present invention, there is provided a method of producing a ceramic green sheet utilizing an exposure process and a development process, comprising a step of forming a light blocking member with a predetermined thickness that does not transmit light used in said exposure process on a front side surface of a member having a portion that can transmit light used in said exposure process, said front side surface being a surface on which a sheet is to be formed, a step of attaching a photosensitive material containing a powder that has a specific electric characteristic on the surface of said member and the surface of said light blocking member, said photosensitive material having sensitivity to the light used in said exposure process, a step of irradiating said photosensitive material with said light from the backside of said member to perform said exposure process with such an exposure dose that said photosensitive material is exposed up to a predetermined thickness from said member, and a step of performing said development process on said photosensitive material after said exposure process.

To achieve the above object, according to the present invention, there is provided a method of producing a ceramic green sheet utilizing an exposure process and a development process, comprising a step of forming a predetermined pattern of a material that does not transmit light used in said exposure process on a base member that can transmit light, a step of attaching a photosensitive material containing a powder that has a specific electric characteristic on said base member and said material, said photosensitive material having sensitivity to said light, a step of irradiating said photosensitive material with said light from the backside of said base member to perform said exposure process with such an exposure dose that said photosensitive material is exposed up to a predetermined thickness from said base member, and a step of performing said development process on said photosensitive material after said exposure process.

In the above-described production process, it is preferred that the thickness of said photosensitive material attached be larger than the thickness of the material forming said pattern, and the predetermined thickness of said photosensitive material exposed by said exposure process be substantially equal to the thickness of the material that forms said pattern. It is also preferred that the thickness of said photosensitive material attached be substantially equal to the thickness of the material that forms said pattern, and the predetermined thickness of said photosensitive material exposed by said exposure process be substantially equal to the thickness of the material that forms said pattern.

To achieve the above object, according to the present invention, there is provided a method of manufacturing a multilayer ceramic electronic part, comprising a step of stacking a plurality of ceramic green sheets including a ceramic green sheet produced by the above-described method of producing a ceramic green sheet, and a step of applying a pressure to said stacked ceramic green sheets in their thickness direction to form a laminated member.

To achieve the above object, according to the present invention, there is provided a method of producing a ceramic green sheet utilizing an exposure process and a development process, comprising a step of attaching a photosensitive material containing a powder that has a specific electric characteristic on a front side surface of a member having a portion that can transmit light used in said exposure process, said front side surface being a surface on which a sheet is to be formed, and said photosensitive material having sensitivity to said light, a step of irradiating said photosensitive material with said light from the backside of said member to perform said exposure process with such an exposure dose that said photosensitive material is exposed up to a predetermined thickness from said member is exposed, and a step of performing said development process on said photosensitive material after said exposure process.

The present invention is characterized in that exposure is performed on a photosensitive material formed on a surface of a member that can transmit light from the backside of the member to enable accurate control of the thickness of the photosensitive material remaining on the member after exposure and development (i.e. the thickness of a solidified slurry portion that will be described later). Accordingly, production methods that include a process of exposing a photosensitive material on a surface of a member that can transmit light from the backside of the member are considered to constitute the production method according to the present invention. In other words, even methods including a step of forming various types of layers such as a layer for facilitate releasing, a ceramic layer and a layer composed of a conductor pattern and a ceramic portion prior to performing the above-mentioned process also fall within the scope of the present invention, as will be described in detail in the description of the embodiments. In addition, methods of producing a sheet in which a plurality of layers are laminated by repeatedly performing exposure from the backside of the member and development also fall within the scope of the present invention.

As per the above, the above-described production method may further comprises a step of forming a light blocking portion made of a material that does not transmit said light in a predetermined area on the surface of said member, prior to the step of attaching said photosensitive material to the surface of said member. In this case, it is preferred that said predetermined thickness be equal to the thickness of said light blocking portion. Furthermore, in the above-described production method, releasing processing may be applied on said member to facilitate releasing of said ceramic green sheet from the surface of said member.

In the above-described production method, said member may include a portion that is to be separated and removed from said ceramic green sheet and a portion to constitute a part of said ceramic green sheet. In this case, a part of said ceramic green sheet may be a layer made of a material different from said photosensitive material. A part of said ceramic green sheet may be made of a material obtained by exposing said photosensitive material and a material that does not transmit said light.

Furthermore, after carrying out the step of forming said light blocking portion on the surface of said member, the step of attaching said photosensitive material, the step of exposing said photosensitive material and the step of developing said photosensitive material in the above-described production method, a step of forming an additional light blocking portion on the outermost surface of the obtained sheet, a step of attaching an additional photosensitive material, a step of exposing said additional photosensitive material from the backside of said member and a step of developing said additional photosensitive material may be performed. In this case, the material for forming the light blocking portion and the material for forming the additional light blocking portion are not necessarily the same, and the photosensitive material and the additional photosensitive material are not necessarily the same.

To achieve the above object, according to the present invention, there is provided a method of manufacturing a multilayer ceramic electronic part comprising a step of stacking a plurality of ceramic green sheets including a ceramic green sheet produced by the above-described method of producing a ceramic green sheet, and a step of applying a pressure to said stacked ceramic green sheets in their thickness direction to form a laminated member. The ceramic green sheet produced by the production method according to the present invention is superior in the degree of accuracy of the thickness than sheets produced by conventional production methods. Therefore, if high quality electronic parts are to be obtained, it is preferred that all of the sheets used be produced by the production method according to the present invention. However, in accordance with requirements on the characteristics of electronic parts, the parts may be manufactured with mixed use of sheets produced by the method according to the present invention and sheets produced by conventional method. This may be advantageous in reducing the manufacturing cost.

According to the present invention, it is possible to produce a ceramic green sheet and a ceramic green sheet including an internal electrode formed therein in which unevenness of layers is relatively small. By the method of the present invention, it is possible to reduce variations in electric characteristics of multilayer ceramic electronic parts and to reduce the frequency of occurrence of or to prevent interlaminate separation during sintering of a laminated member.

In the case in which an electrode or a ceramic green sheet is formed by conventional screen printing or using a coater, unevenness is created on its surface due to various causes such as viscosity of slurry as mentioned above. Such unevenness generally remains after exposure performed from the front side and development. Furthermore, when slurry or the like is applied, extended portions or thin portions are sometimes created, and this may cause short circuit or conduction failure in an electronic part manufactured in some cases. When the application thickness is to be reduced further, there is a lower limit depending on various conditions such as the viscosity, and in addition, it is difficult to keep variations in the dimension in the thickness direction small.

According to the present invention, the thickness of a layer is precisely controlled in terms of the distance from the surface of a base member on which the layer is formed by controlling the exposure dose. Accordingly, controllability of the sheet thickness is greatly improved as compared to conventional methods in which a ceramic sheet made of a material having a desired electric characteristic is produced by applying slurry that contains powder having a specific electric characteristic by screen printing or using a coater. Thus, it is possible to provide a sheet having a small thickness that could not attained in the past with excellent uniformity in the thickness. Therefore, it is possible to manufacture electronic parts of a smaller size having excellent electric characteristics while reducing variations.

BRIEF DESCRIPTION OF THE DRAWINGS

FIG. 3A is a flow chart showing a process of producing a ceramic green sheet according to a first applied mode of the embodiment of the present invention.

THE BEST MODE FOR CARRYING OUT THE INVENTION

Figure 1:
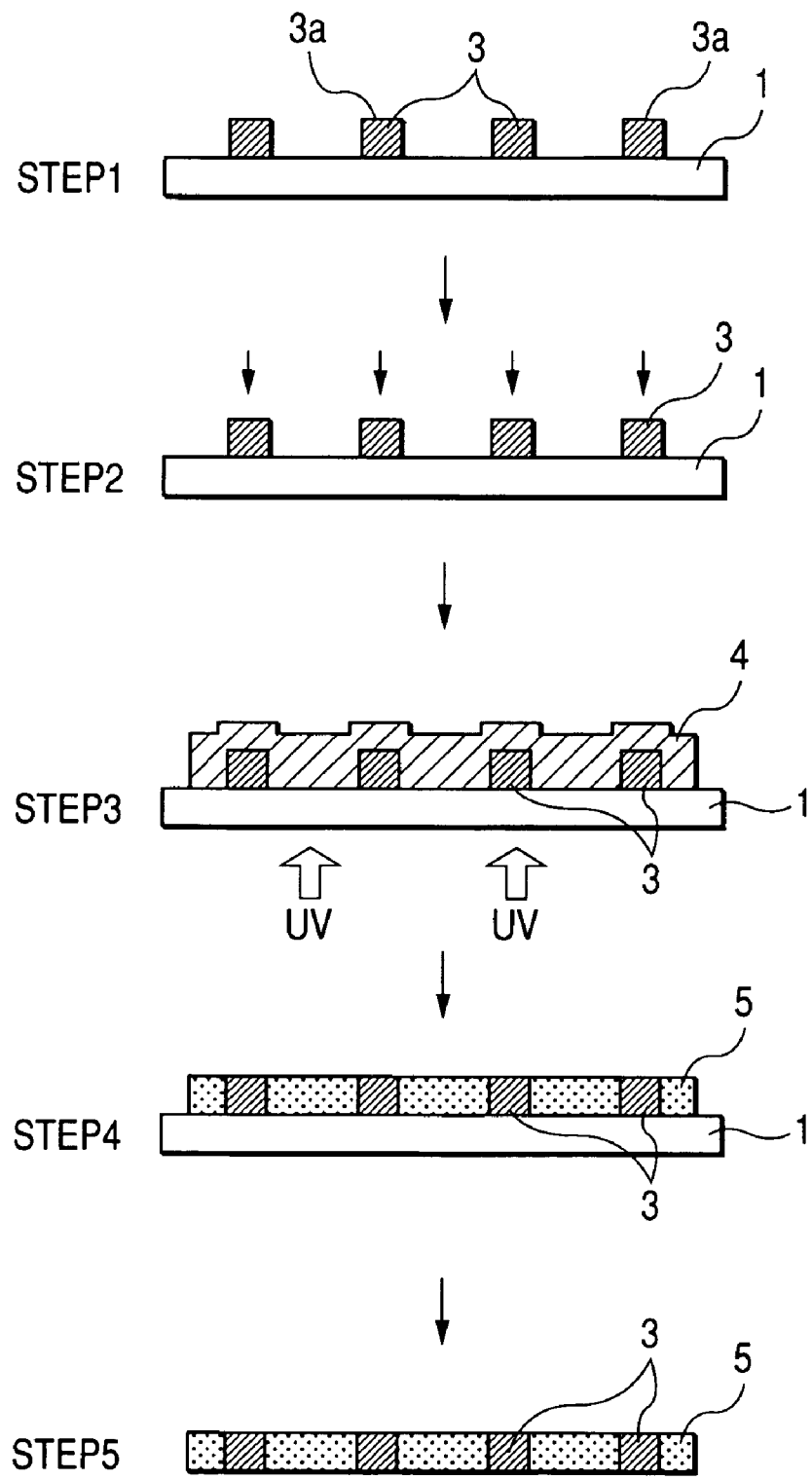
FIG. 1 is a flow chart showing a process of producing a ceramic green sheet according to an embodiment of the present invention.

In the following, embodiments of the present invention will be described in detail with reference to the drawings. FIG. 1 illustrates a method of forming a single layer of a ceramic green sheet including electrodes, the method being related to a method of manufacturing electronic parts according to an embodiment of the present invention. FIG. 1 shows cross sections of the sheet in the respective process steps. The process steps proceed in the order indicated by arrows. In FIG. 1, a base member 1 is, for example, a PET film on which appropriate processing for enhancing releasability is applied using a transparent silicon resin or the like. In step 1, electrode portions 3 are formed, by screen printing an electrically conductive paste that is conventionally used for forming electrode, on the surface of the base member 1 on which the processing for enhancing releasability has been applied. The electrode portions are formed as light blocking portions made of a material that does not transmit ultraviolet light used in the exposure process that will be described later. The electrode portions have a predetermined thickness and formed in a predetermined pattern.

The top surface 3a of each electrode formed by screen printing is typically uneven due to surface undulation etc. In view of this, in step 2, pressure is applied on the upper surfaces 3a of the electrodes on the sheet in this state to make the upper surfaces 3a even and to make the thickness of the electrode portions 3 uniform. This process may be eliminated in the case where the evenness of the upper surfaces 3a and the thickness of the electrode portions meet desired conditions.

In subsequent step 3, photosensitive slurry 4 for forming a ceramic layer is applied on the top surface of the base member 1 and the electrode portions 3. The photosensitive slurry is composed mainly of a mixture of a negative type organic binder that becomes insoludable against developing solution by irradiation with, for example, ultraviolet light and a ceramic powder having a specific dielectric constant or other electric characteristics. This photosensitive slurry includes a powder having a specific electric characteristic and is used as a photosensitive material that has sensitivity to ultraviolet light. The photosensitive slurry 34 is applied not only on the portion of the top surface of the base member in which the electrode portions 3 are not formed but also on the top surfaces of the electrode portions 3.

The photosensitive slurry 4 is irradiated with ultraviolet light from the side opposite to the surface of the base member 1 on which the electrodes 3 are formed (i.e. form the backside), so that exposure of the photosensitive slurry is effected. Through this exposure process and the development process that will be described later, the photosensitive slurry 4 becomes a solidified slurry portion 5. In the exposure process, the electrode portion 3 functions as an exposure mask for the photosensitive slurry to block ultraviolet light. Thus, exposure of the photosensitive slurry present on the top face of the electrode portions 3 is prevented. Accordingly, the photosensitive slurry 3 on the top face of the electrode portions 3 is solved and removed in the next development process. In addition, it is possible to control the thickness of the photosensitive slurry 4 (or the solidified slurry portion 5) that remain unsolved after development by appropriately controlling the light quantity in the exposure process, or the light intensity and exposure time, and development conditions.

Through the above-described process, the solidified slurry portion 5 and the electrode portions 3 having a uniform thickness are formed on the surface of the base member 1. According to this method, it is possible to accurately control the thickness of the solidified slurry portion 5 as will be described later. It is also possible to make the thickness of the solidified slurry portion 5 and the thickness of the electrode portions 3 uniform. After that, the layer including the solidified slurry portion 5 and the electrode portions are separated from the base member 1, and used as a ceramic green sheet for manufacturing electronic parts.

As described above, according to the present invention, the electrode portions 3 that will constitute internal electrodes are firstly formed on the surface of the base member 1, and the photosensitive slurry 4 is applied thereon. After that, exposure is performed from the backside of the base member 1. In the exposure process, it is possible to control the thickness of the solidified slurry portion 5 with a high degree of accuracy by appropriately controlling irradiation conditions of ultraviolet light used in the exposure process and optimizing development conditions. Thus, it is possible to produce a ceramic green sheet including internal electrodes 3 and a ceramic dielectric portion having a thickness substantially the same as the thickness of the internal electrodes and almost free from an interface gap in the thickness direction.

In the above-described process, the film thickness of the solidified slurry portion 5 after exposure and development is influenced by characteristics of the ceramic powder contained therein or other factors. However, by optimizing conditions of each process, it can be formed with variations of approximately ±2 to 3%. In ordinary cases, a ceramic green sheet is formed using a doctor blade. In that case, there are variations in the film thickness of approximately ±3 to 5%. This means that by applying the present invention, it is possible to produce a ceramic green sheet with a more uniform film thickness.

Figure 2:
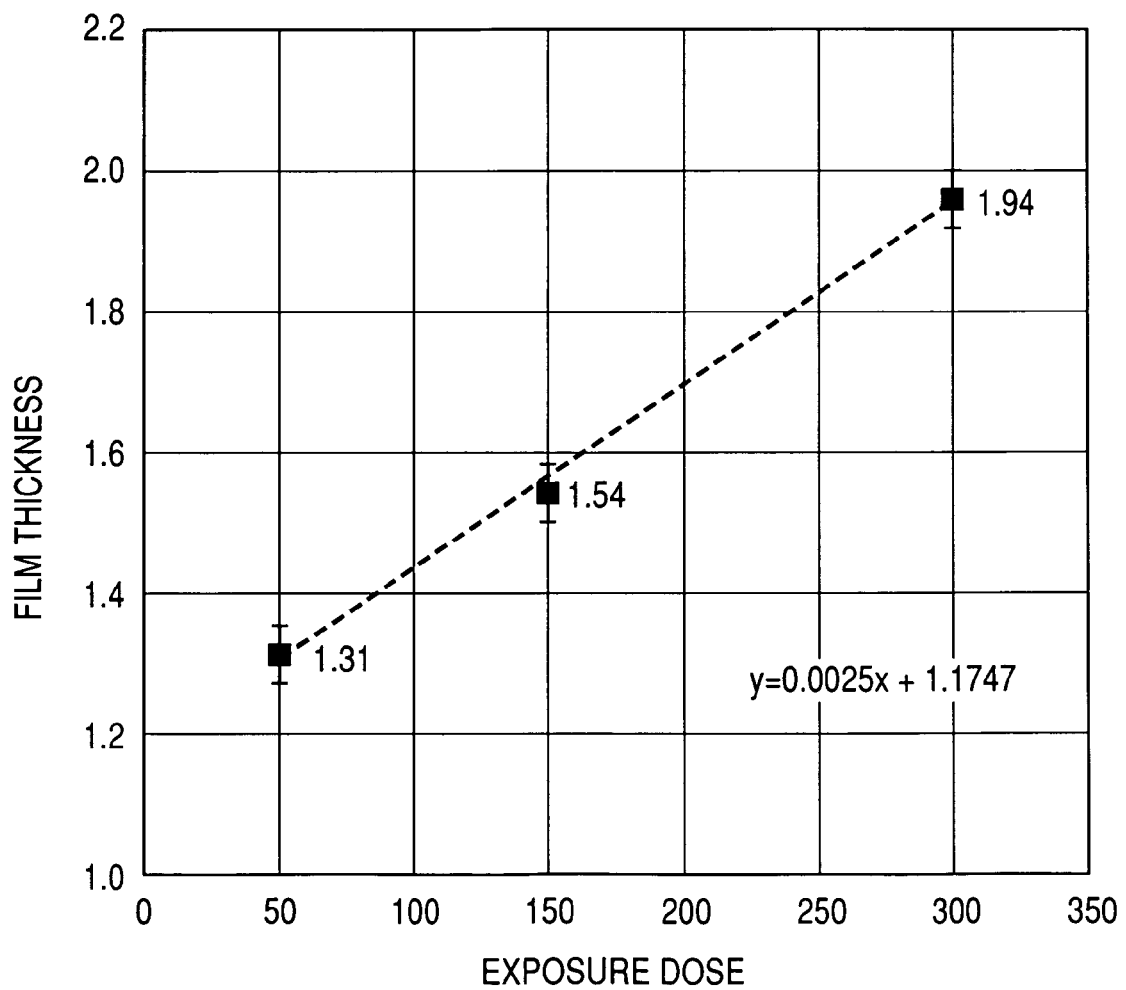
FIG. 2 is a graph showing a relationship between the exposure dose and the thickness of photosensitive slurry remaining after development.

FIG. 2 shows an example of relationship between the irradiation dose of the ultraviolet light and the film thickness of the ceramic green sheet obtained after exposure and development. In FIG. 2, the horizontal axis represents the exposure dose per unit area of ultraviolet light having a wavelength of 405 nm, and the vertical axis represents the thickness of the sheet after development. The photosensitive slurry used was a mixture of barium titanate powder with a particle diameter of approximately 0.2 μm and a negative type binder mixed at a volume ratio of 1 to 1. This slurry was applied on a surface of a base member (not shown) up to a slurry thickness of 8 μm, and then it was subjected to exposure from the backside of the base member. The illuminance of the ultraviolet light during the exposure was 50 mw per unit area, and the exposure dose was changed by changing the irradiation time.

In developing process, a sample was immersed in developing solution or 1 weight percent aqueous solution of sodium carbonate maintained at a temperature of 30° C. for 30 seconds, and subsequently immersed in purified water maintained at 30° C. for 90 seconds. As will be seen from FIG. 2, there is a distinct correlation between the exposure dose and the thickness of the resultant sheet. As shown by error bars in FIG. 2, variations in the film thickness are regularly fall within the range of ±0.5 to 2.0%. As per the above, it was verified that it is possible to control the exposed thickness of the photosensitive slurry containing a powder having predetermined electric characteristics or the thickness of the sheet by changing the exposure dose. The invention has been made based on this verified fact.

Figure 3B:
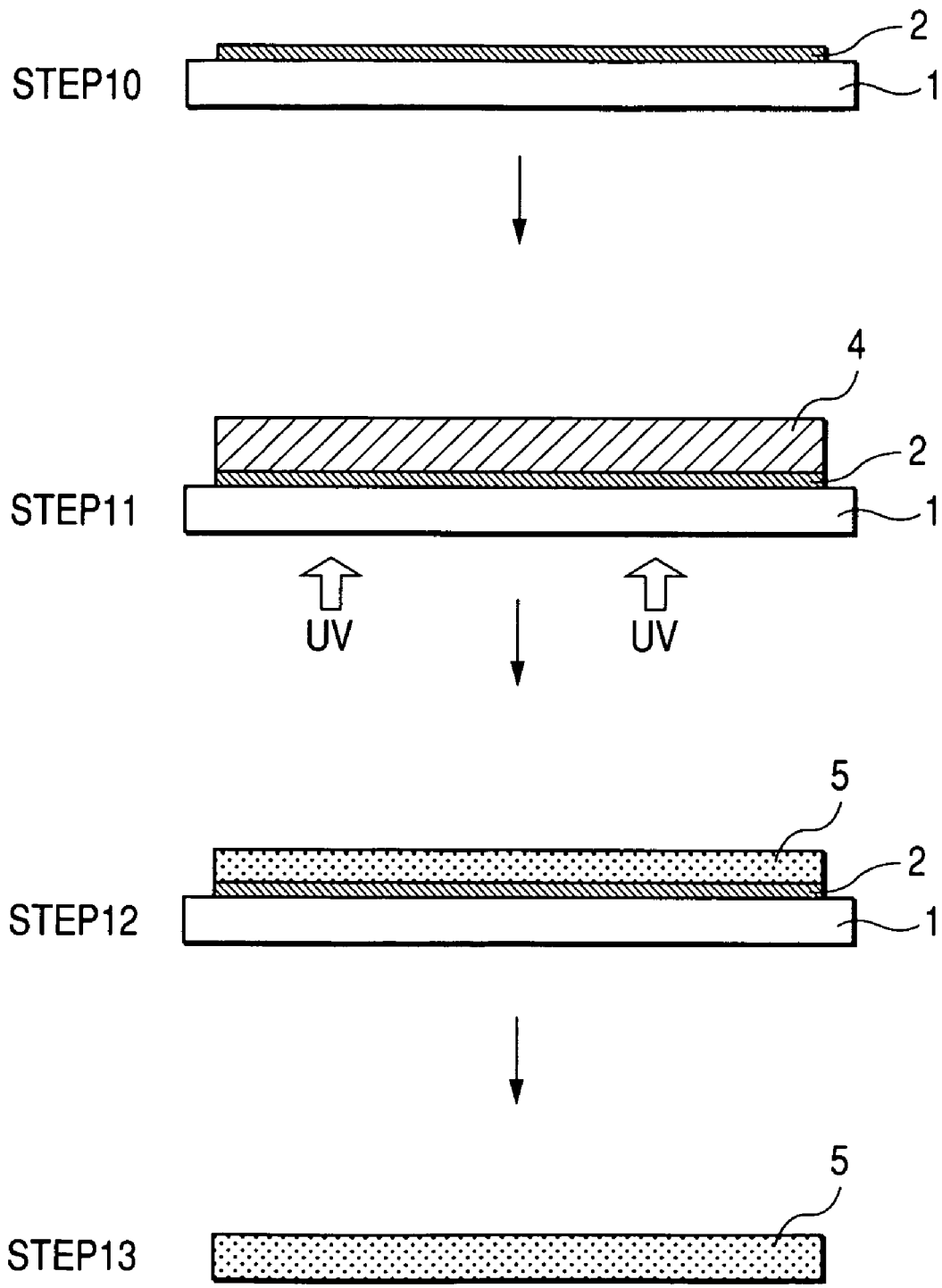
FIG. 3B is a flow chart showing a process of producing a ceramic green sheet according to the first applied mode of the embodiment of the present invention.

In view of the above-described fact, a method of forming a ceramic green sheet composed only of a ceramic dielectric layer will be described with reference to FIGS. 3A and 3B as a first applied mode of the present invention. In FIGS. 3A and 3B, components similar to those in the embodiment shown in FIG. 1 are designated by the same reference numerals. FIGS. 3A and 3B are cross sectional views showing a base member 1 and a solidified slurry portion 5 in a process of forming a solidified slurry portion 5 on the surface of a base member 1. In step 11, photosensitive slurry 4 is applied on the surface of the base member 1. The photosensitive slurry applied has a thickness larger than a predetermined thickness. The method of applying the slurry is not limited particularly. In subsequent step 12, the photosensitive slurry 4 is irradiated with ultraviolet light from the backside of the base member 1, so that a predetermined thickness of the photosensitive slurry is exposed. After that, an optimized development process is performed to dissolve and remove the portion of the photosensitive slurry 4 other than the predetermined thickness exposed. After the above process, the base member 1 is removed. In this way, ceramic green sheets with small variations in thickness can be produced (step 13).

When a ceramic green sheet is produced only by applying slurry directly on a base member, the thickness of the slurry with which slurry can be applied substantially uniformly on the base member is generally restricted by various conditions such as viscosity of the slurry. For this reason, it has been considered difficult to produce a ceramic green sheet having a thickness smaller than a certain thickness. According to the present invention, slurry is applied with a thickness with which application of slurry is easy, and the thickness of the sheet is controlled in the subsequent exposure process. As described before, in the exposure process, it is possible to control the thickness of the exposed portion (that is, the thickness of the ceramic green sheet that will remain after development) independently from the thickness of the slurry that has been applied. Thus it is possible to control to make the thickness of the sheet smaller than the minimum thickness that can be attained by conventional production methods.

As described before, releasing (or parting) processing has been applied on the surface of the base member 1. However, in some cases, a material on which releasing processing cannot be applied may be used for the base member 1, for some reasons such as cost saving. In such cases, a releasing layer (designated by reference numeral 2 in FIG. 3B) that can transmit light may be formed on the surface of the base member on which no surface processing has been applied, and a layer made of photosensitive slurry 4 may be formed on the releasing layer. Alternatively, a layer having a spreading prevention function for preventing spreading of edges of a portion such as a light blocking portion when it is formed may be formed as a layer 2. In this case, this layer 2 will be eventually separated and removed from the solidified slurry portion together with the base member 1. The base member 1 and the layer 2 are integrally function as a member having a portion that blocks light.

Figure 3C:
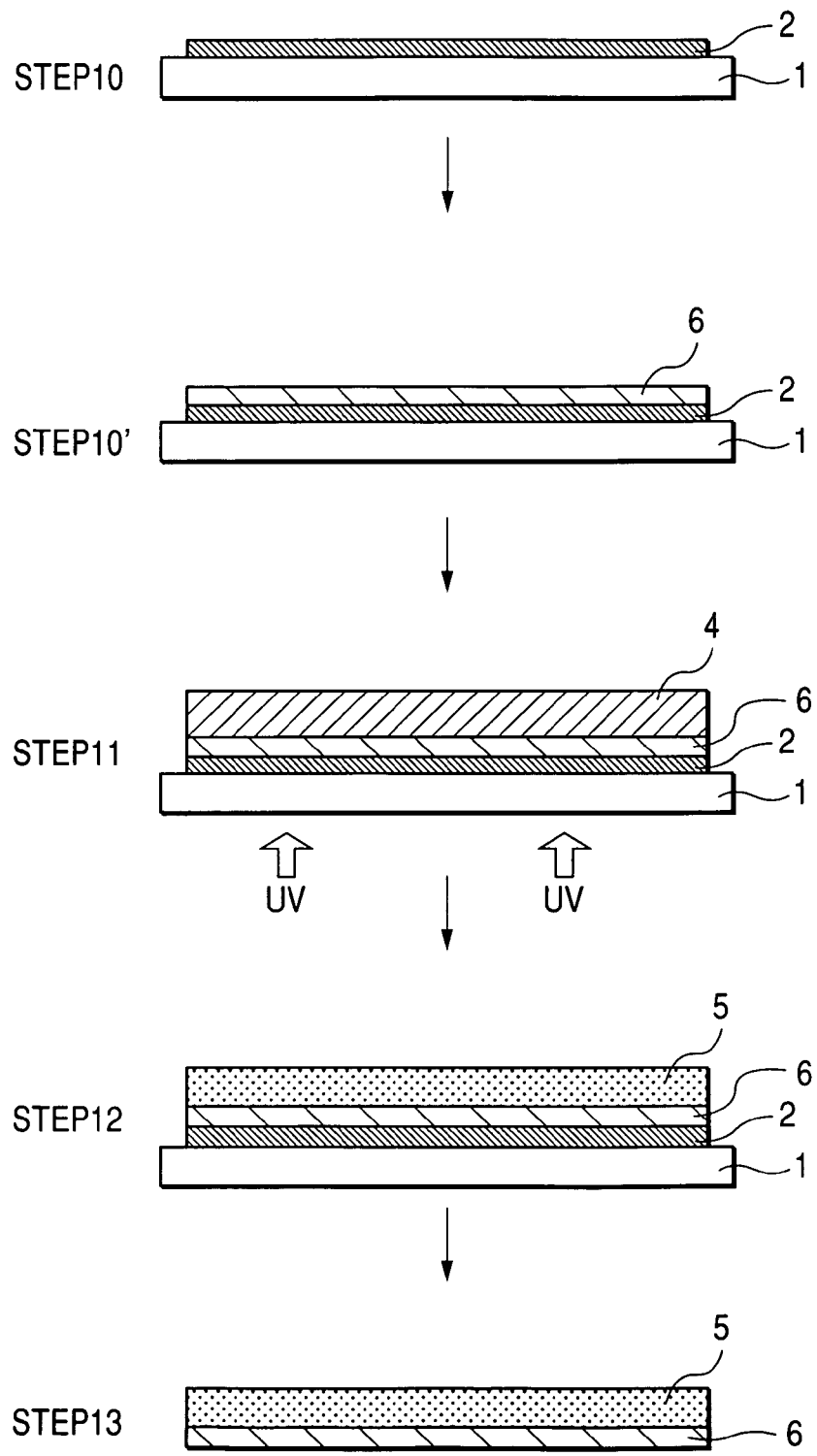
FIG. 3C is a flow chart showing a process of producing a ceramic green sheet according to the first applied mode of the embodiment of the present invention.

In cases where electronic parts etc. are formed by laminating ceramic green sheets, one of the sheets, for example the sheet for forming the bottom layer of electronic parts may sometimes be required to have an electric characteristic different from the specific electric characteristic. In such cases, it is preferred that a sheet in which a plurality of layers respectively having desired characteristics are laminated be formed. The method shown in FIG. 3C corresponds to such a case.

Specifically, a releasing layer 2 is formed on base member 1 (step 10). On the releasing layer 2, a ceramic layer 6 that can transmit light is formed (step 10'). The ceramic layer 6 is formed for a purpose different from the purpose of the solidified slurry portion 5 that will be formed in a later step. In connection with this, in some cases, the ceramic layer 6 is not required to have a degree of uniformity as high as the degree of uniformity required in forming the solidified slurry portion 5. Accordingly, the ceramic layer 6 may be formed by the process illustrated in steps 10 to 12 in FIG. 3A, or alternatively by a conventional application method. In this case, the base member 1 and the layer 2 are separated from the ceramic green sheet by a separating operation, while the ceramic layer 6 constitutes a part of the ceramic green sheet.

Figure 4:
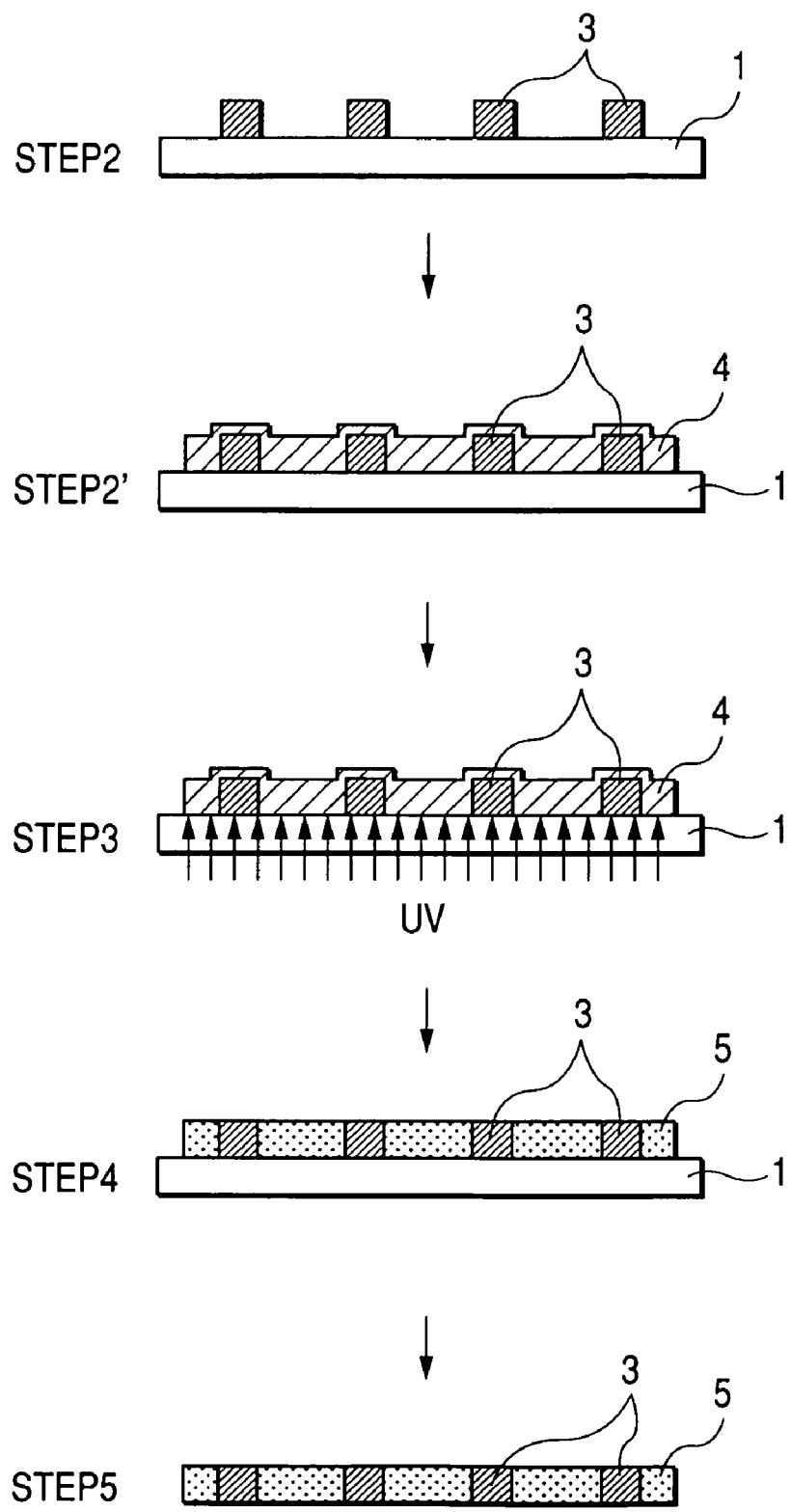
FIG. 4 is a flow chart showing a process of producing a ceramic green sheet according to a second applied mode of the embodiment of the present invention.

According to the present invention, exposure of the photosensitive slurry applied on the top of the electrodes can be prevented for sure, and it is possible to remove the slurry on the surface of the electrodes reliably by the developing process. A second applied mode of the present invention focuses on this. Specifically, in some cases, the thickness of the electrode portions and the ceramic green sheet that includes the electrode portions may be relatively large and acceptable electric characteristics can be sufficiently achieved by conventional technologies of applying photosensitive slurry. In the following, the second applied mode of the present invention will be described with reference to FIG. 4.

Firstly in step 2, electrode portions 3 are formed on the surface of a base member 1 on which a releasing processing has been applied. This process may be performed in the manner same as step 1 of the above-described embodiment of the present invention. Subsequently, photosensitive slurry 4 for forming a ceramic layer is applied on the top surface of the base member 1 and the electrode portions 3. The photosensitive slurry 4 is applied up to a thickness substantially equal to the thickness of the electrode portions 3 by a conventional application method. In this process, the slurry 4 is applied not only on the top surface of the base member 1 but also on the top surface of each of the electrode portions 3 (step 2').

The photosensitive slurry 4 is irradiated with ultraviolet light from the side (or the backside) of the base member 1 that is opposite to the surface on which the electrode portions 3 are formed, so that the photosensitive slurry 4 is exposed throughout its thickness. Through this exposure process and a development process that will be described later, the photosensitive slurry turns into a solidified slurry portion 5. In the exposure process, the electrode portion 3 blocks the ultraviolet light to function as a mask against exposure of the photosensitive slurry 4. Thus, exposure of the photosensitive slurry present on the top surface of the electrode portions 3 can be prevented reliably. Accordingly, the top surfaces 3a of the electrode portions are revealed by the development process, namely, the electrodes are in a state in which they can be easily brought into excellent contact with, for example, other electrodes when connected therewith.

Figure 5:
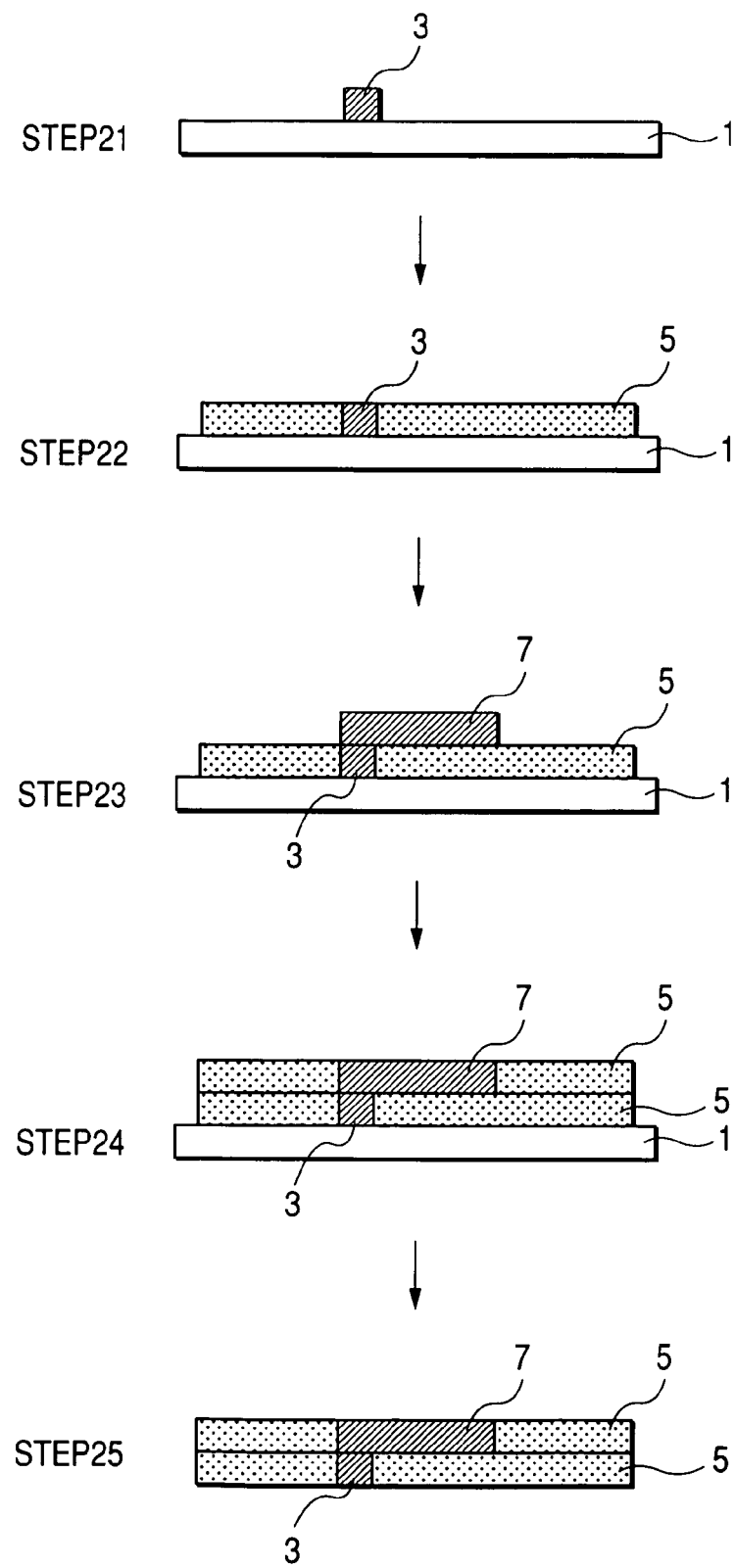
FIG. 5 is a flow chart showing a process of producing a ceramic green sheet according to a third applied mode of the embodiment of the present invention.

FIG. 5 shows a process as a third applied mode of the present invention in which a patterned electrode and a so-called post for connecting the patterned electrode to a different electrode in another ceramic green sheet are formed. In step 21 in FIG. 5, an electrode portion 3 serving as a post is formed on the surface on a base member on which releasing processing has been applied. The electrode portion 3 functions as a light blocking member in the exposure process. Then, application of photosensitive slurry 4 as a first photosensitive material, exposure of the photosensitive slurry 4 from the backside of the base member 1 up to a first predetermined thickness, and dissolution and removal of excess photosensitive slurry by development are further performed to form a sheet composed of a base member 1, a post electrode 3 and a solidified slurry portion 5 shown in step 22.

In step 23, a patterned electrode 7 that will constitute an internal electrode is formed on the top surface of the sheet shown in step 22. The patterned electrode 7 functions as a light blocking member in the exposure process. Moreover, photosensitive slurry 4 is applied again as a second photosensitive material on the top surface of the patterned electrode 7. Although the first photosensitive material and the second photosensitive material are the same material in this embodiment, different materials may be used in accordance with electric characteristics required. After application of the photosensitive slurry 4, second exposure of the photosensitive slurry 4 from the backside of the base member 1 up to a second predetermined thickness, and second dissolution and removal of excess photosensitive slurry 4 by development are performed to form a sheet composed of a base member 1, a post electrode 3, a patterned electrode 7 and a solidified slurry portion 5 shown in step 24.

After that, the base member is removed from the sheet. Thus, a ceramic green sheet having an internal patterned electrode and a post can be produced (step 25). In implementing this mode, it is preferred that materials used for the photosensitive slurry be selected in such a way that the solidified slurry can transmit the light used in exposure. This mode includes the process of forming two layers. However, the lower layer may be interpreted as a member having a portion that transmits light used in exposure or a modification of the base member. Then, this applied mode may be regarded as the embodiment of the present invention repeated plural times.

Figure 6:
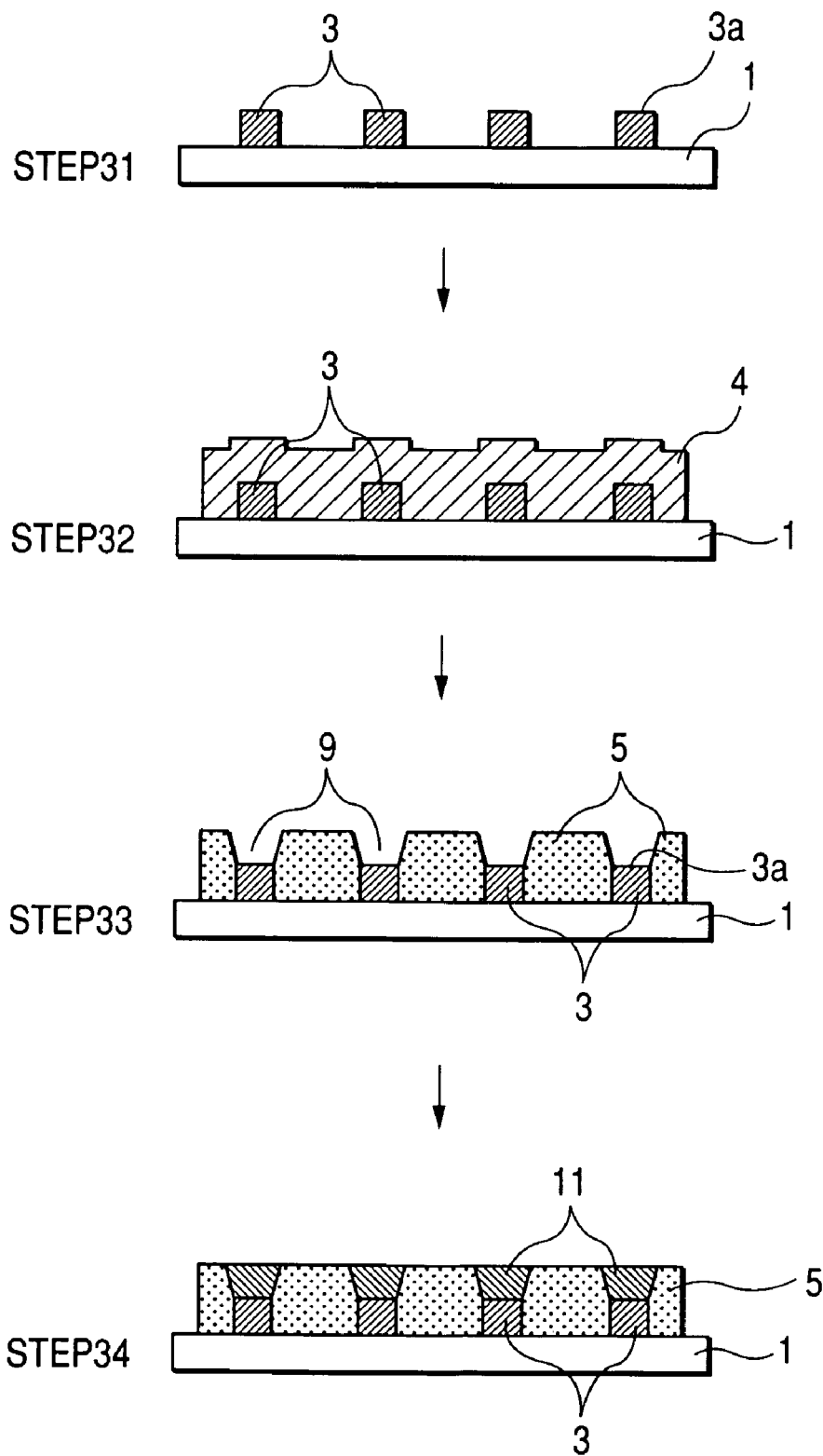
FIG. 6 is a flow chart showing a process of producing a ceramic green sheet according to a fourth applied mode of the embodiment of the present invention.

In forming, for example, a post, circuit design may sometimes require to form an electrode having a thickness that cannot be achieved by ordinary screen printing. The present invention can be applied even in such cases. In the following, a method of forming a thicker electrode will be described with reference to FIG. 6 as a fourth applied mode of the present invention. In step 31 in FIG. 6, electrode portions 3 as posts are formed on a base member 1 on which releasing processing has been applied. In subsequent step 32, application of photosensitive slurry 4 and exposure from the backside of the base member 1 are performed. In this process, the exposure dose is controlled in such a way that a portion of the photosensitive slurry within a predetermined thickness is exposed irrespective of the thickness of the electrode portion 3.

After the exposure, excess photosensitive slurry 4 is dissolved and removed by development. Thus, a sheet composed of the base 1, the post electrodes 3 and the solidified slurry portion 5 as shown in step 33 is formed. Since the electrode portion 3 functions as a mask, the photosensitive slurry on the top surface 3a of the electrode portion 3 is not exposed. Accordingly, that portion of photosensitive slurry 4 is removed by the development process. Thus, penetration patterns 9 conforming with the internal electrode portions 3 are formed in the solidified slurry portion 5 having a predetermined thickness in a self-aligning manner.

In step 34, the penetration patterns 9 on the top of the electrode portions 3 are filled with, for example, electrically conductive paste to form additional electrode portions 11. In this way, the internal electrodes having top surfaces coplanar with the top surface of the solidified slurry portion 5 are formed. By the above-described process, it is possible to pile electrode portions with a high degree of accuracy. Thus, it is possible to produce by a relatively simple process, internal electrode portions having a thickness that cannot be achieved by an ordinary process.

As described above, by carrying out the invention, it is possible to produce a ceramic green sheet having a uniform film thickness in which internal electrodes and a dielectric layer or an insulating layer having a predetermined characteristic are included. In practice, the ceramic green sheet is used as a material for manufacturing an electronic part such as a multilayer ceramic capacitors and a multilayer ceramic inductor. In the following, an example of methods of manufacturing a multilayer ceramic capacitor and a multilayer ceramic inductor will be described. In the drawings that will be referred to in the following descriptions, elements or steps that are similar to those described in the foregoing descriptions will be designated by the same or like reference numerals and step numbers.

Figure 7:
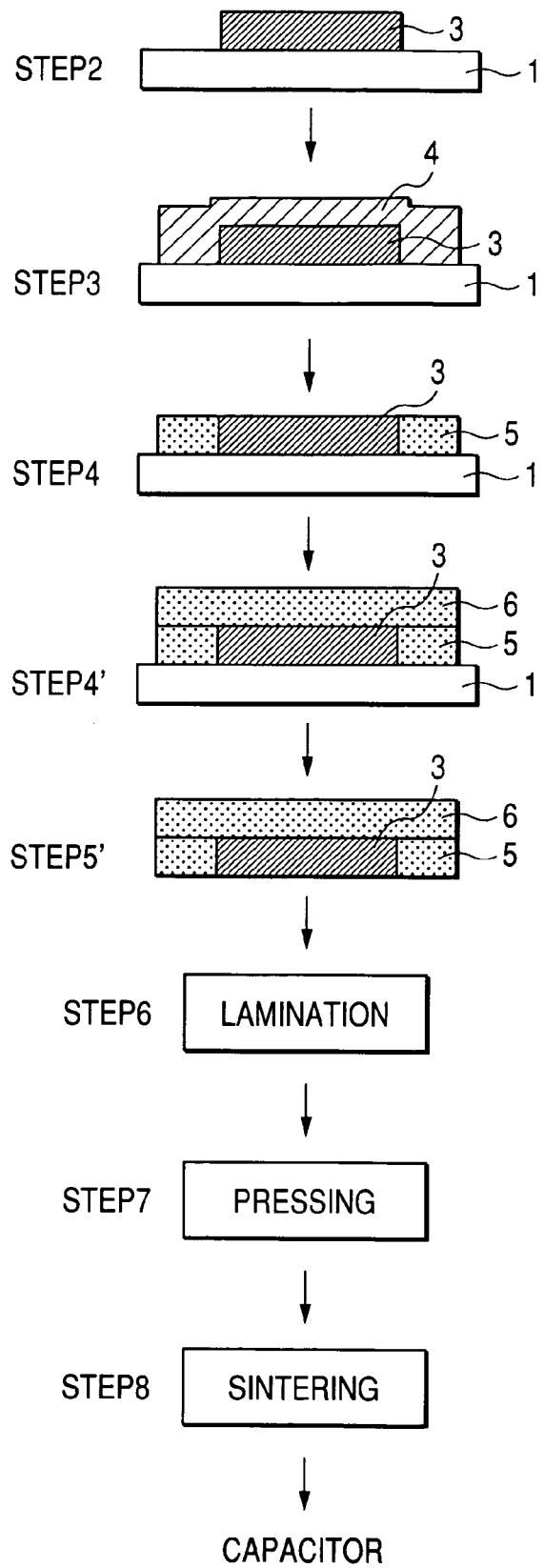
FIG. 7 is a flow chart showing the outline of a process of producing a multilayer ceramic capacitor using the present invention.

FIG. 7 shows the outline of a method of manufacturing a multilayer ceramic capacitor. Firstly in step 2, an electrode portion 3 having a predetermined thickness is formed on a base member 1. The product to be produced by this process is a capacitor, and the electrode portion 3 will be used as an electrode of the capacitor. Accordingly, the electrode portion 3 is formed as a flat plate, though the shape cannot be explicitly seen from the cross sectional view of FIG. 7. Through subsequent steps 3 and 4, a dielectric portion (or a solidified slurry portion 5) and the electrode portion 3 having a predetermined thickness are formed on the base member 1.

In this method, a dielectric portion 6 having a predetermined thickness is additionally formed on the electrode portion 3 etc. in step 4'. After that, the base member 1 is removed from the electrode portion 3 etc. in step 5'. Thus, a ceramic green sheet used for manufacturing capacitors is obtained. Ceramic green sheets produced by the above-described method are laminated and pressed along the thickness direction to bring the sheets into close contact with each other. The laminated ceramic green sheet after pressing is sintered, and terminal electrodes etc. are formed on the outer surface thereof. Thus, a multilayer ceramic capacitor is obtained.

In this method, in order to reduce the number of process steps, the dielectric portion 6 is formed directly on the electrode portion 3 etc. in step 4'. The dielectric portion 6 may be formed by various methods such as printing and a method using a doctor blade. However, in some cases, the dielectric portion 6 is required to have a higher degree of uniformity. In such cases, it is preferred that a sheet composed of a solidified slurry portion be formed in advance in accordance with the above-described first applied mode, and the sheet 5 thus obtained and a ceramic sheet composed of an electrode portion 3 and a dielectric portion (5) be used. By laminating these sheets and applying the process of pressing and sintering (steps 6 to 8), multilayer ceramic capacitors in which variations in electric characteristics are small as compared to capacitors produced by the above-described method can be obtained.

Figure 8:
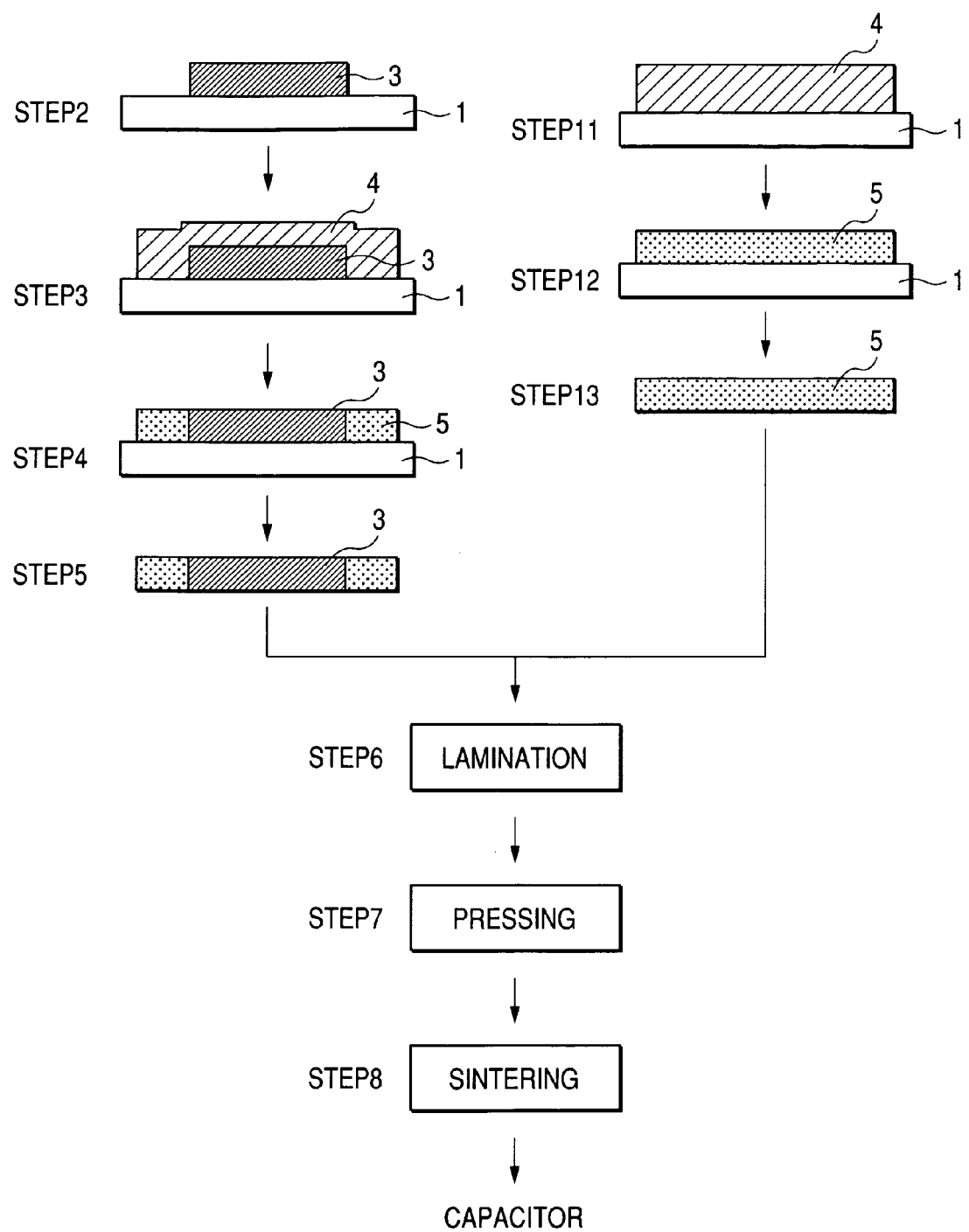
FIG. 8 is a flow chart showing the outline of a process of producing a multilayer ceramic capacitor using the present invention.
Figure 9:
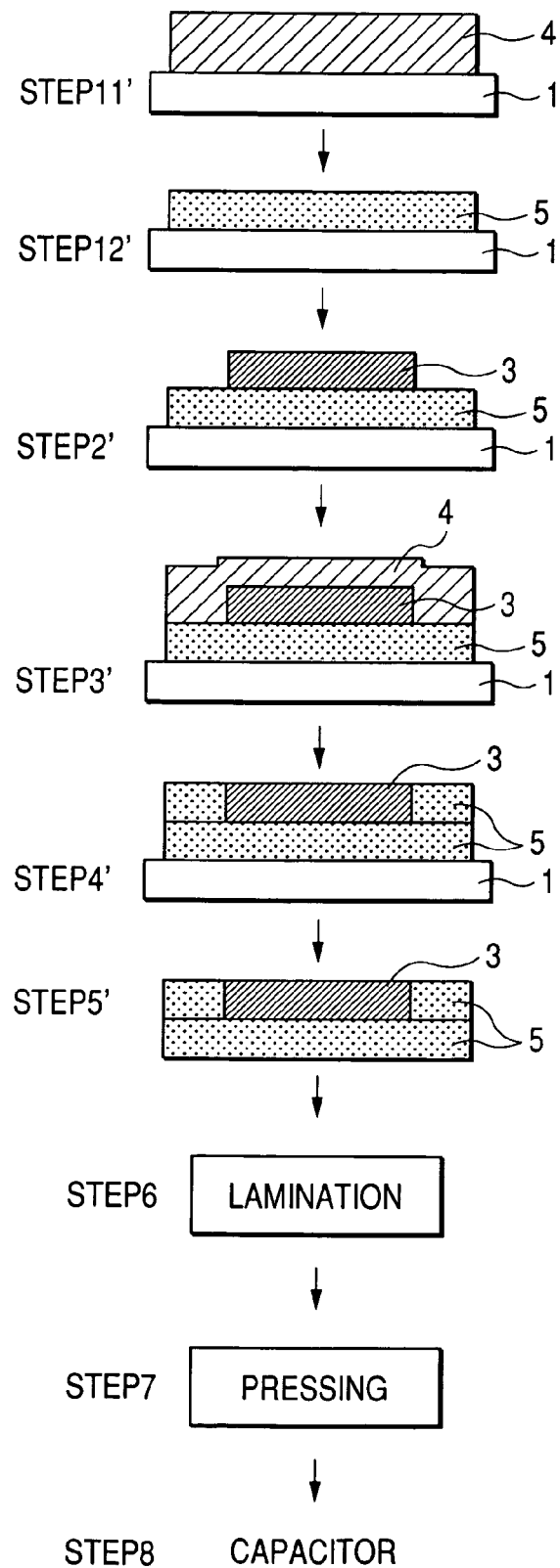
FIG. 9 is a flow chart showing the outline of a process of producing a multilayer ceramic capacitor using the present invention.

Alternatively, as shown in FIG. 9. the method may be modified in such a way that a solidified slurry portion 5 is formed on a base member 1 in accordance with the first applied mode of the present invention (steps 11' and 12') and the base member 1 and the solidified slurry portion 5 are used as a new base member on which a portion composed of an electrode portion 3 and a dielectric portion (5) are formed (steps 2' to 4'). In this case, since it is necessary that the solidified slurry portion transmits the light such as ultraviolet light that is used in the exposure process sufficiently, limitations may possibly be placed on the material of the photosensitive slurry. However, as is the case with the method shown in FIG. 8, it is possible to control the thickness of each sheet easily. Accordingly, multilayer ceramic capacitors in which variations in electric characteristics are small can be obtained.

In this method, the thickness of the solidified slurry 5 formed on the base member 1 is controlled by performing exposure from the backside of the base member. However, in some cases, the sheet obtained by this method may be used as the outermost layer of a multilayer capacitor, or the sheet may be used to constitute not a capacitor but a wiring portion. In such cases, a high degree of accuracy in the thickness of the solidified slurry portion is not required, and the layer may be formed by, for example, a conventional exposure process performed from the front side without strict thickness control with a view to simplify the process.

Figure 10:
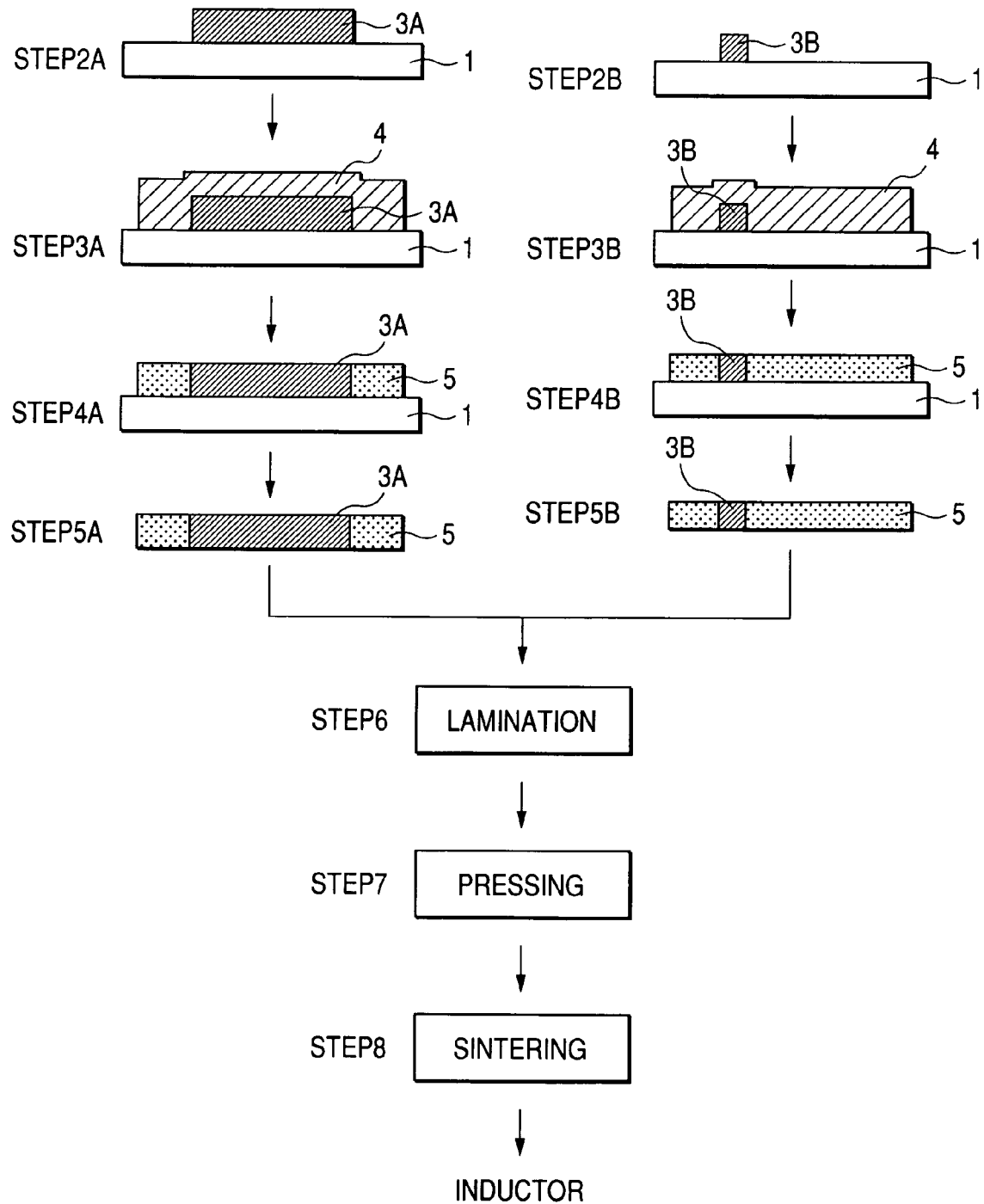
FIG. 10 is a flow chart showing the outline of a process of producing a multilayer ceramic inductor using the present invention.

FIG. 10 shows the outline of a method of manufacturing a multilayer ceramic inductor. Firstly in steps 2A and 2B, an electrode portions 3A and 3B having a predetermined thickness are formed on respective base members 1. The product to be produced by this process is an inductor, and the electrode portions 3A and 3B will be used as electrodes of the capacitor. Accordingly, the electrode portion 3A is formed in a frame-like shape with a partial cutout portion when viewed from above, though the shape is not explicitly seen from the cross sectional view of FIG. 10. The electrode portion 3B is formed in a pillar-like shape and used as a post electrode for connecting the electrode portions 3A formed in the ceramic green sheets laminated just below and above the ceramic green sheet including this electrode portion 3B. The body of the inductor is produced by laminating these electrode portion 3A and the electrode portion 3B in an order. Subsequently, photosensitive slurry 4 is applied on the base member 1 and the electrode portion 3A or 3B through steps 3A and 3B.

Each of these sheets is subjected to exposure from the backside of the base member 1 and development, so that an electrode portion 3 and a dielectric portion or magnetic material portion (5) are formed on the base member 1 (steps 4A and 4B). Ceramic green sheets are obtained by removing the base members 1 from the sheets (steps 5A and 5B), and the ceramic green sheets thus obtained are laminated in an order (step 6). The ceramic green sheets after lamination are pressed in their thickness direction (step 7) and sintered (step 8), and thereafter terminal electrodes etc, are formed on the outer surface thereof. Thus, a multilayer ceramic inductor is obtained.

Figure 11A:
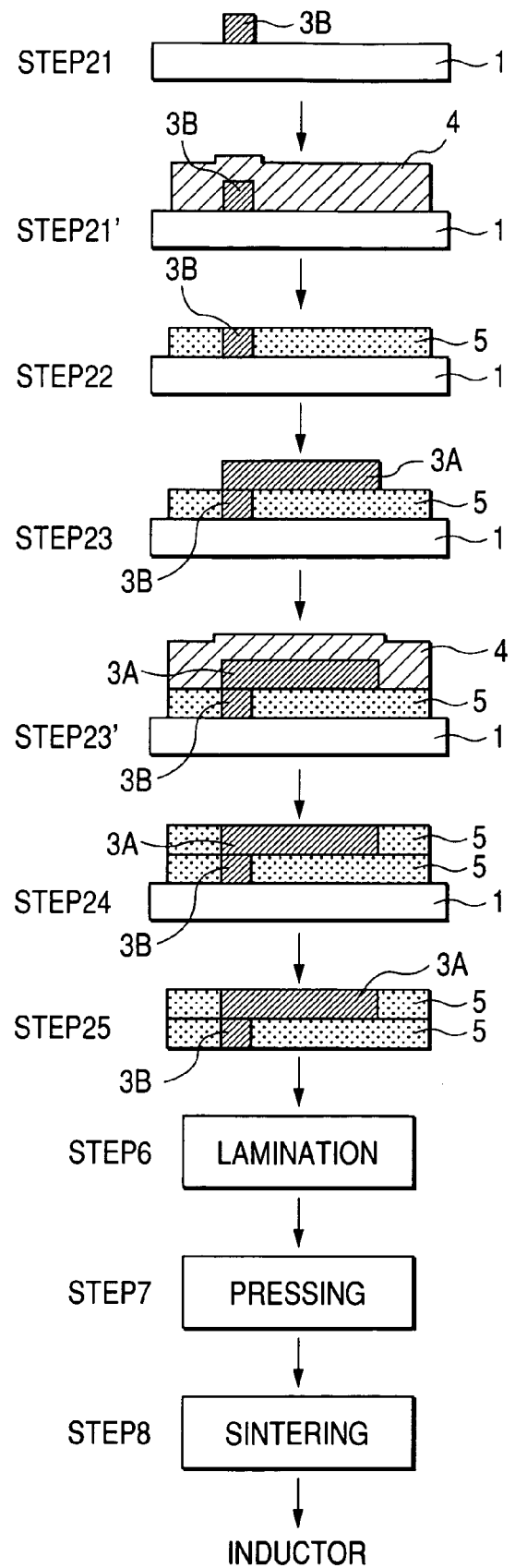
FIG. 11A is a flow chart showing the outline of a process of producing a multilayer ceramic inductor using the present invention.
Figure 11B:
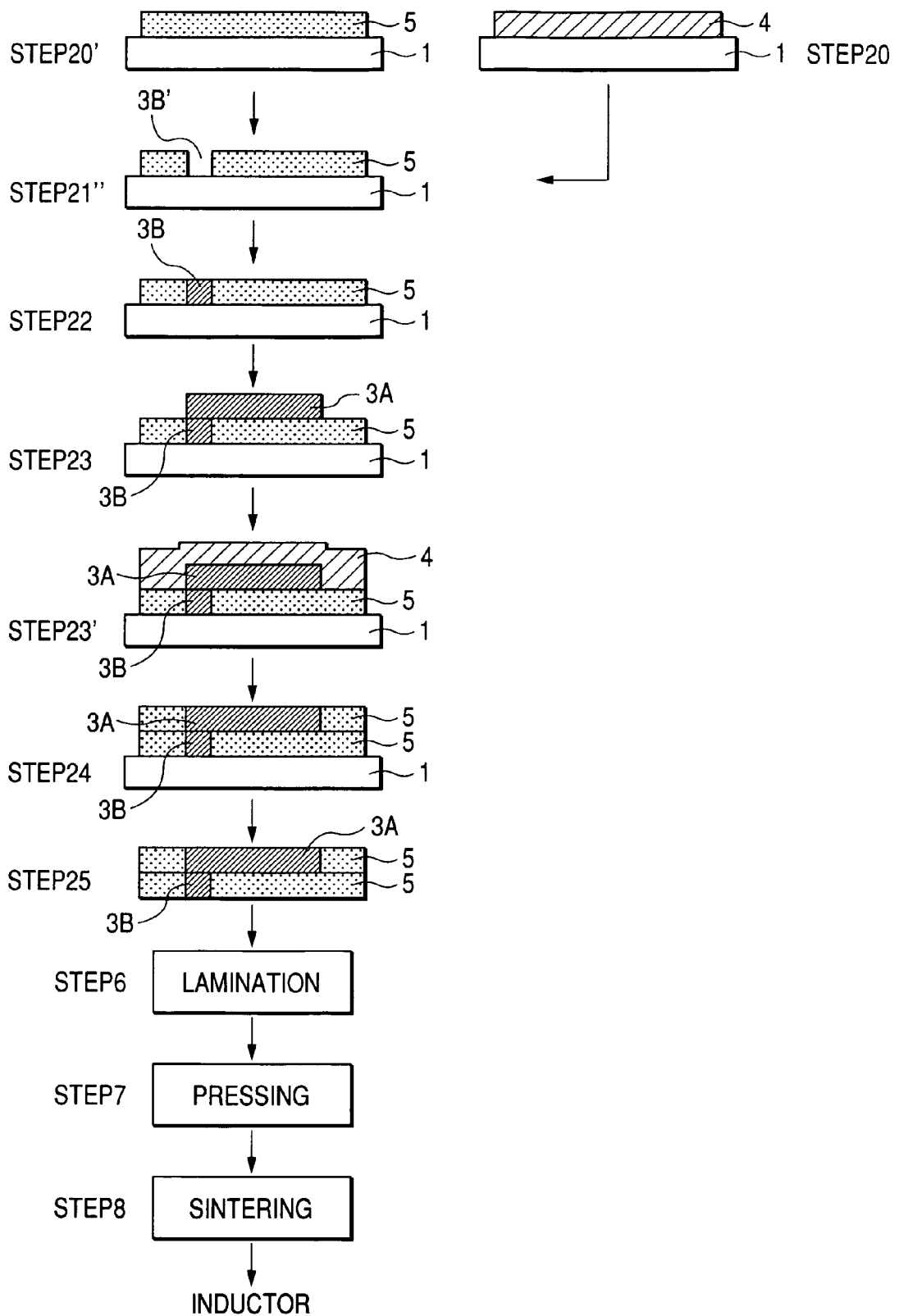
FIG. 11B is a flow chart showing the outline of a process of producing a multilayer ceramic inductor using the present invention.

In some cases, in producing an inductor by the method shown in FIG. 10, an increase in the number of laminated layer may be required in order to obtain an inductor having desired characteristics. In such cases, the number of connections of electrode portions between layers may increase and the reliability of connection may be deteriorated. Furthermore, in the case that the width (the thickness along the plane of the drawing sheet) of the electrode portion 3A that will constitute the body of the inductor is made smaller, it may be sometimes difficult to align the electrode portion 3A and the electrode portion 3B upon laminating them. FIGS. 11A and 11B show a method of manufacturing an inductor that can cope with such situations. In this method, the third applied mode shown in FIG. 5 is applied.

The method shown in FIG. 11A is intended to manufacture an inductor, and the electrode portion 3 in FIG. 5 corresponds to a post electrode portion 3B, and the patterned electrode portion 7 corresponds to a patterned electrode portion 3A having a frame-like shape. Subsequently, a ceramic green sheet shown in step 25 including the post electrode portion 3B and the patterned electrode 3A connected thereto is obtained in accordance with the process described before in connection with the second applied mode. Sheets thus obtained are laminated in an order, pressed and sintered as shown in steps 6 to 8. After that, terminal electrodes etc. are formed on the outer surface thereof. Thus, a multilayer ceramic inductor with a higher degree of lamination accuracy is obtained. By applying this method in manufacturing an inductor, the number of laminated layers is decreased, and the number of connections of electrode portions between layers is also decreased. Accordingly, it is possible to enhance the degree of lamination accuracy and reliability of connections.

When a sheet produced by the above-described method is used as an end portion of an inductor in manufacturing a multilayer ceramic inductor, a high degree of accuracy in the thickness of the post electrode 3A shown in FIG. 11A is not required in some cases. In such cases, the layer including the post electrode 3A may be formed using a conventional technology as shown in FIG. 11B to simplify the process or to reduce the process cost. Specifically, a solidified slurry portion 5 is formed on the base member 1 using a conventional method (step 20'), a through hole 3B' is formed by a mechanical punching process or laser processing etc. (step 21'), and the through hole 3B' is filled with an electrode material to produce the layer. Alternatively, the through hole 3B' may be produced by applying photosensitive slurry 4 on the base member 1 by a predetermined thickness and performing ordinary exposure and patterning etc.

As per the above, according to the present invention, a ceramic green sheet including an internal electrode with excellent uniformity in the thickness can be produced. The ceramic green sheet according to the present invention is excellently flat, and the pressure in the pressing process after lamination may be set lower than 100 kg/cm$^2$. This value varies depending on factors such as the disposition of the electrode in the sheet, the material of the photosensitive slurry used, and the viscosity of the photosensitive slurry, and it may be reduced to less than 50 kg/cm$^2$, if conditions allow. Accordingly, deformation upon pressing will be reduced, and it is possible to achieve desired electric characteristics with a high degree of accuracy. In addition, it is possible to greatly reduce the frequency of occurrence of deformation such as delamination caused during sintering due to the pressing process. Moreover, since the pressure applied in pressing maybe greatly reduced, the manufacturing equipment can be made simple. Thus, it is possible to realize a significant reduction in the manufacturing cost.

Examples of the metal material used in forming the internal electrode are Ag, Ni, AgPd, Pd, Cu etc. in a powder form, and an example of the organic binder is ethylcellulose. However, the present invention is not limited by these materials, and it is preferred that they are selected appropriately from various materials in accordance with electric characteristics and the method of forming the electrode portion. Although in the above-described embodiments, screen printing was mentioned as an example of a method of forming an electrode portion, it may be formed by so-called photo processing performed by exposure and development. By utilizing the photo processing, it is possible to control the shape and position of the electrode portion with a higher degree of accuracy.

Figure 12:
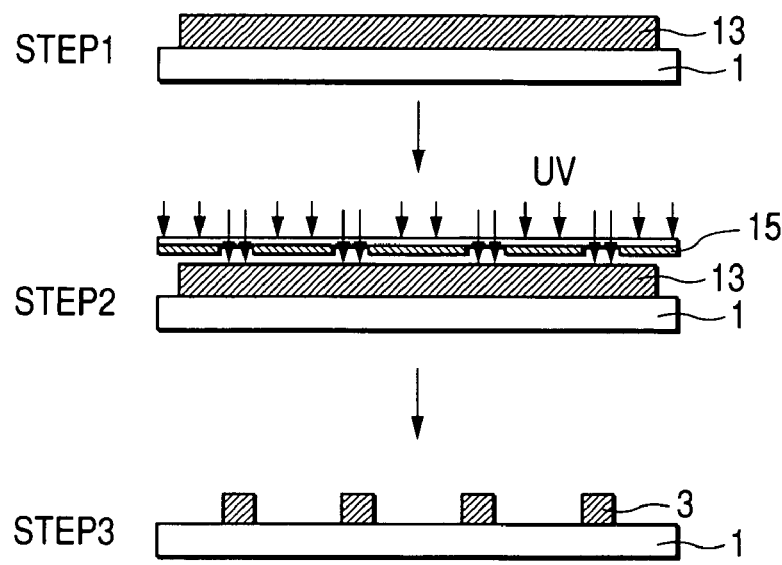
FIG. 12 illustrates an example of a process of forming an electrode portion on a base member.
Figure 13:
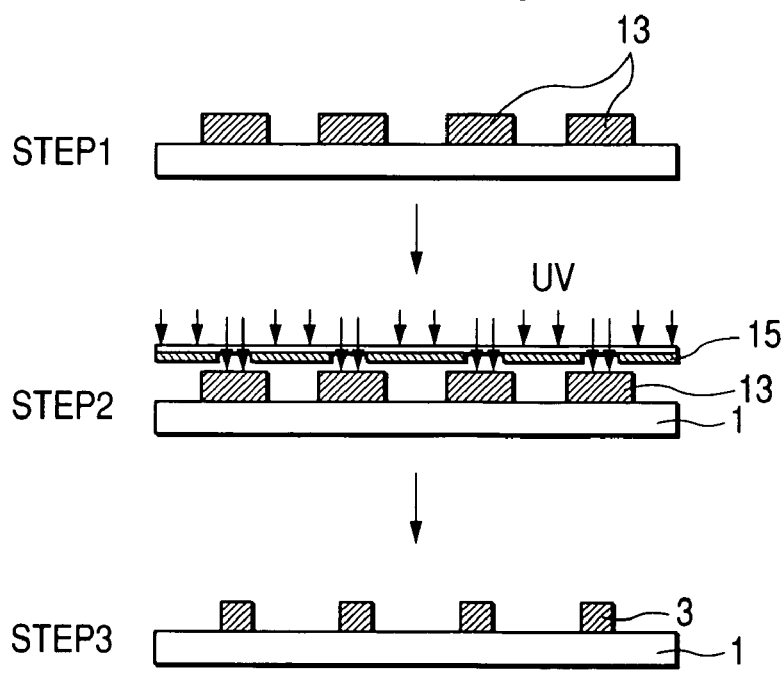
FIG. 13 illustrates an example of a process of forming an electrode portion on a base member.

Here, a method of forming an electrode portion using photo processing will be briefly described with reference to FIGS. 12 and 13 that show the outline of the method. FIGS. 12 and 13 schematically show cross sections of a base member 1 and electrode portions 3 etc. The process proceeds in the order indicated by arrows in FIGS. 12 and 13. In step 1 of FIG. 12, an electrode portion 13 made of electrically conductive metal powder and organic binder is formed on a base member 1. The electrode portion 13 has sensitivity to, for example, ultraviolet light. In subsequent step 2, it is irradiated with ultraviolet light through a photomask 15 to expose a pattern of electrode portions 3. By developing it, electrode portions 3 are formed with a high degree of accuracy. By carrying out the above process, it is possible to control the shape and position of the electrode portion with a higher degree of accuracy. In addition, as to the cross sectional shape, it is easy to form vertical side surfaces and to form tapers etc. Accordingly, it would be possible to enhance conformity of the electrodes and the solidified slurry portion by controlling formed side surface of the like.

In connection with the above, in some cases, the areas on which the electrode portions 3 are formed may be small as compared to the surface area of the base member 1. In such cases, it is preferred that the area on which the photosensitive electrode portion 13 is formed be restricted to some extent by using screen printing etc. in advance as shown in FIG. 13. By forming photosensitive electrode portions 13 only in the neighborhood of the positions at which the electrode portions 3 are to be formed, it is possible to reduce the amount of the photosensitive material for forming electrodes and the amount of developing solution etc., to thereby reduce the cost of the process. In addition, the amount of the photosensitive electrode material that is to be removed by development is also reduced, and therefore the time taken by development can be reduced. This is an additional advantage.

Although in the above-described embodiments, the photosensitive slurry is composed of an organic binder having a negative type characteristic and a dielectric material, specifically barium titanate, the present invention is not limited by these features. It is preferred that the material of the organic binder be selected fitly taking into consideration various characteristics such as exposure characteristics, viscosity, separability. The present invention may be applied not only to capacitors and inductors but also various other multilayer ceramic electronic parts such as resistors, varistors, thermistots and piezoelectric elements. Accordingly, powder materials used in the present invention may be various materials having desired electric characteristics such as dielectric materials, glass-based materials, ferrite materials and other ceramic materials containing metal oxide.

Although in the embodiments, exposure is performed using ultraviolet light, it is preferred that the light be changed to other light that is suitable for exposure in accordance with the characteristics of the organic binder material used, namely, in accordance with the characteristics of the photosensitive material. Furthermore, although the electrode portion is used as a mask in the exposure process, the present invention is not limited by this feature. It is preferred that not only the electrode material but also various materials that do not transmit light used in the exposure process be used in accordance with desired electric characteristics etc. Still further, although photosensitive slurry is used in forming a layer made of a dielectric material, various methods of attaching or forming a photosensitive material on a base member, such as attaching a photosensitive sheet on the base member, may be used.

Although methods of manufacturing a multilayer ceramic capacitor and a multilayer ceramic inductor have been described here, application of the present invention is not limited to these examples. A layer produced by the embodiment of the present invention may be used as a part of a plurality of layers. By appropriately using a ceramic green sheet produced in accordance with the present invention in manufacturing a multilayer electronic part, it is possible to easily provide an electronic part having electric characteristics superior to electronic parts manufactured using a sheet produced by conventional technologies.

What is claimed is:

1. A method of producing a ceramic green sheet utilizing an exposure process and a development process, comprising the steps of:

attaching a first photosensitive material containing a powder that has a specific electric characteristic on a surface of a base member that can transmit light used in said exposure process, said first photosensitive material having sensitivity to said light;

irradiating said first photosensitive material with said light from the backside of said base member to perform said exposure process with such an exposure dose that said first photosensitive material is exposed up to a first predetermined thickness from said base member;

performing said development process on said first photosensitive material after said exposure process, forming a light blocking portion composed of a member that does not transmit the light used in said exposure process on a surface of said first photosensitive material after said development process;

attaching a second photosensitive material containing a powder that has a specific electric characteristic on a surface of said light blocking portion and said first photosensitive material after said development process, said second photosensitive material having sensitivity to said light;

irradiating said second photosensitive material with said light from the backside of said base member to perform said exposure process with such an exposure dose that said second photosensitive material is exposed up to a second predetermined thickness from the surface of said first photosensitive material; and performing said development process on said second photosensitive material after said exposure process.

2. A production method according to claim 1 further comprising a step of forming a different light blocking portion other than said light blocking portion on the surface of said base member, prior to the step of attaching said first photosensitive material to said base member and exposing and developing it, said different light blocking portion being composed of a member that does not transmit the light used in said exposure process.

3. A production method according to claim 2, wherein the first predetermined thickness of the exposed portion of said first photosensitive material is substantially equal to the thickness of said different light blocking portion.

4. A production method according to claim 1 or 2, wherein the second predetermined thickness of the exposed portion of said second photosensitive material is substantially equal to the thickness of said light blocking portion.

5. A method of producing a ceramic green sheet utilizing an exposure process and a development process, comprising the steps of:

forming on a front side surface of a base member which transmits an exposing light used in said exposure process, a layer which includes a ceramic material and transmits said exposing light, and a light blocking member with a predetermined thickness that does not transmit said exposing light on a predetermined area of the front side surface of said base member;

attaching a photosensitive material containing a powder that has a specific electric characteristic on said base member and said light blocking member, said photosensitive material having sensitivity to said exposing light;

irradiating said photosensitive material with said light from the backside of said base member to perform said exposure process with such an exposure dose that said photosensitive material is exposed up to a predetermined thickness from the front side surface of said base member; and performing said development process on said photosensitive material after said exposure process.

6. A method of producing a ceramic green sheet utilizing an exposure process and a development process, comprising the steps of:

attaching a photosensitive material containing a powder that has a specific electric characteristic on a front side surface of a member having a portion that can transmit light used in said exposure process, said front side surface being a surface on which a sheet is to be formed, and said photosensitive material having sensitivity to said light;

irradiating said photosensitive material with said light from the backside of said member to perform said exposure process with such an exposure dose that said photosensitive material is exposed up to a predetermined thickness from said member;

performing said development process on said photosensitive material after said exposure process; and forming a light blocking portion made of a material that does not transmit said light in a predetermined area on the surface of said member, prior to the step of attaching said photosensitive material to the surface of said member, wherein after executing the step of forming said light blocking portion on the surface of said member, the step of attaching said photosensitive material, the step of exposing said photosensitive material and the step of developing said photosensitive material, a step of forming an additional light blocking portion on the outermost surface of the obtained sheet, a step of attaching an additional photosensitive material, a step of exposing said additional photosensitive material from the backside of said member and a step of developing said additional photosensitive material are executed.

7. The method according to claim 5, wherein said base member includes another light blocking member which does not transmit the exposing light.

* * * * *